United States Patent [19]

Tarbuck

[11] Patent Number: 4,548,111
[45] Date of Patent: Oct. 22, 1985

[54] SPIRAL ORBITAL SHEAR APPARATUS

[75] Inventor: Robert R. Tarbuck, Ardmore, Pa.

[73] Assignee: Sperry Corporation, New York, N.Y.

[21] Appl. No.: 636,935

[22] Filed: Aug. 2, 1984

[51] Int. Cl.$^4$ ............................................. B21F 11/00
[52] U.S. Cl. ...................................... 83/196; 83/200; 83/580; 83/647.5
[58] Field of Search ................. 83/196, 199, 200, 580, 83/647.5

[56] References Cited

U.S. PATENT DOCUMENTS

| | | |
|---|---|---|
| 146,846 | 1/1874 | Stevens . |
| 596,837 | 1/1898 | Werner . |
| 901,667 | 10/1908 | Wrigley . |
| 2,288,385 | 6/1942 | Beard . |
| 2,348,877 | 5/1944 | Beard . |
| 2,428,650 | 10/1947 | Brunner . |
| 3,494,233 | 5/1968 | Kojima . |
| 4,003,279 | 1/1977 | Carmichael . |

Primary Examiner—Frank T. Yost
Attorney, Agent, or Firm—James R. Bell; Thomas J. Scott; Marshall M. Truex

[57] ABSTRACT

During the assembly of electronic components on circuit boards, the problems of ductile smear cusps produced on wire ends by traditional scissor-type shearing are addressed by a spiral orbital shear apparatus. This apparatus includes a first fixed plate having an array of apertures and a second plate also having the array of apertures. The first and second plates have abutting surfaces. A first eccentric drive member is connected to rotate at a first rate in a first direction. A second eccentric drive member is connected to the second plate and rotates with the first eccentric drive member. The second drive member is also rotated at a second rate in the first direction independently of the rotation of the first drive member.

12 Claims, 5 Drawing Figures

SPIRAL ORBITAL SHEAR APPARATUS

BACKGROUND OF THE INVENTION

1. Field of the Invention

This invention relates generally to cutting by misalignment of apertured tools and more particularly to cut a cylindrical member where misalignment is achieved by spiral motion of one cutting member relative to another stationary cutting member.

2. Background Description

The assembly of electronic equipment such as for mounting multiple lead IC chips and other electronic components on a circuit board, requires the insertion of the fine wire leads (in some cases 24 or 54 wires on each component) into an array of small diameter holes. The tolerance between the wire diameter and hole diameter is very small thus requiring much precision in order to achieve the desired insertion.

At some point during the assembly process the leads are sheared to a uniform length. The shearing operation often creates the presence of sharp, protruding cusps on the sheared ends of the wire leads. The cusps are a result of ductile smear produced by the traditional scissor-type shear operation. These cusps increase the difficulty involved in the insertion step due to the aforementioned small tolerance. Cusps may limit insertion and cause hole damage. As a result, assembly time and scrap rate may be increased.

The foregoing illustrates limitations known to exist in present devices. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing a spiral orbital shear apparatus including a first fixed plate having an array of apertures formed therethrough. A second plate also includes the array of apertures. The first and second plates have abutting surfaces. A first eccentric drive member is connected to be rotated by a first rotating means at a first rate in a first direction. A second eccentric drive member is connected to the second plate and is connected to rotate with the first eccentric drive member. A second rotating means moves the second drive member at a second rate in the first direction independently of the first rotating means.

The foregoing and other aspects will become apparent from the following detailed description of the invention when considered in conjunction with the accompanying drawing. It is to be expressly understood, however, that the drawing is not intended as a definition of the invention but is for the purpose of illustration only.

DESCRIPTION OF THE PREFERRED EMBODIMENT

Figure 2:
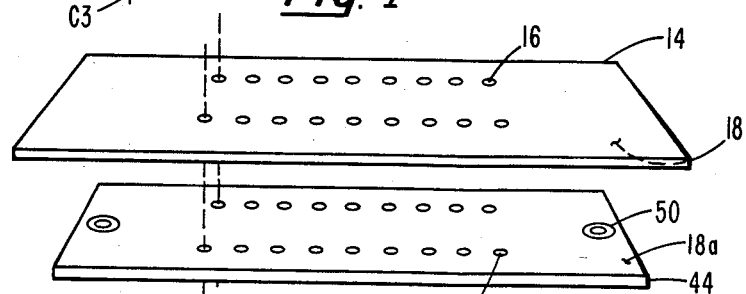
FIG. 2 is a perspective view illustrating an embodiment of the first and second plates including matched arrays of apertures.
Figure 3:
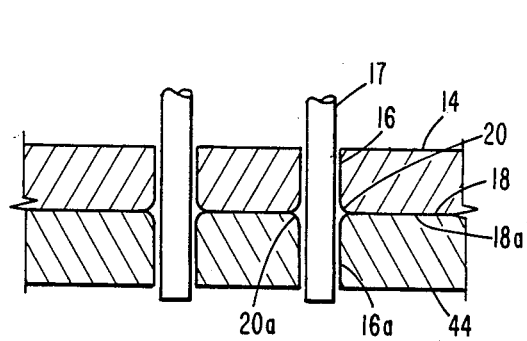
FIG. 3 is an exploded view in cross-section illustrating an embodiment of the aligned apertures having wires inserted therethrough.

Referring now to the Figures of the drawing, a spiral orbital shear apparatus generally designated 10. A support member 12 is formed of a suitable material and is provided to support a plate 14 suitably fixed to support 12. Plate 14 includes an array of apertures 16 (exemplary in FIGS. 1 and 2) formed therethrough and also includes a planar surface 18. Plate 14 is formed of a suitable hardened material. The array is appropriate for receiving wires 17 (typically 24 or 54 in number) extending from a state-of-the-art electronic component 15 (shown in dotted line) of the type mounted on a well-known circuit board. Each aperture 16 is of a sufficient size (diameter) to receive a wire 17 and allows for a suitable tolerance over and above the wire 17 diameter. Although not necessary, each aperture 16 may include a rounded edge 20 (FIG. 3) adjacent planar surface 18.

A first eccentric drive member 22 is formed of a suitable material and is mounted in commercially available bearings 24, for rotation relative to stationary support member 12. A first means for rotating including a suitable belt 26 having a gripping surface 28, is connected to an associated gripping surface of a pinion 30 preferably connected to a commercially available fractional horsepower electric motor (not shown) via a drive shaft 32. Belt 26 is connected to rotate first drive member 22 in a clockwise direction, as indicated by a directional arrow, at a suitable first rate, e.g. 32 revolutions in a given time period.

A second eccentric drive member 34 formed of a suitable material, is mounted in commercially available bearings 36 in first drive member 22. This permits second drive member 34 to rotate relative to first drive member 22. Centroidal axis C1 of first drive member 22 is offset from the centroidal axis C2 of second drive member 34. In this manner, the centroidal axis C2 of second drive member 34 is rotated about the centroidal axis C1 of first drive member 22 in response to rotation of first drive member 22 by belt 26.

As with the first means for rotating, a second means for rotating, including a suitable belt 36 having a gripping surface 38, is connected to an associated gripping surface of a pinion 40 preferably connected to a commercially available fractional horsepower electric motor (not shown) via a drive shaft 42. Belt 36 is connected to rotate second drive member 34 in a clockwise direction, as indicated by a directional arrow, at a suitable second rate slower than the first rate, e.g. 31 revolutions in the above-mentioned given time period.

A second plate 44 is formed of a suitable hardened material and includes the above-mentioned array of apertures 16a formed therethrough matched with apertures 16 of first plate 14 (see FIG. 2) and also incudes a planar surface 18a abutting planar surface 18 of first plate 14. Each aperture 16a may also include a rounded edge 20a adjacent planar surface 18a.

Second drive member 34 includes an extension 48 mounted in commercially available bearings 50 in second plate 44 to permit second drive member 34 to be rotated by belt 36 relative second plate 44. Centroidal axis C3 of extension 48 is offset from the centroidal axis C2 of second drive member 34. In this manner, the centroidal axis C3 of extension 48 is rotated about the centroidal axis C2 of second drive member 34 by belt 36 independently of the above-mentioned rotation of C2 about C1.

Figure 1:
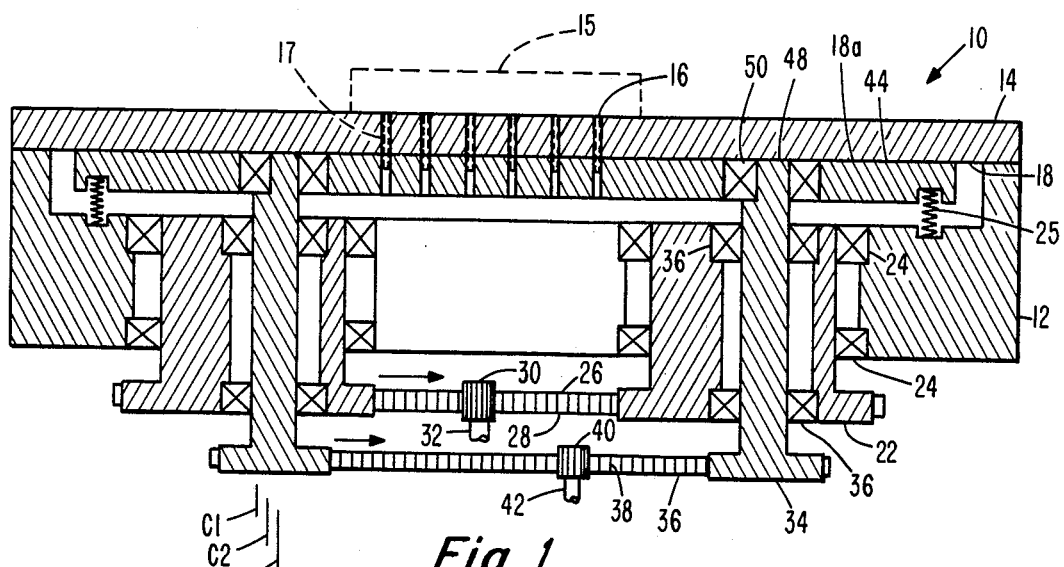
FIG. 1 is a cross-sectional view illustrating an embodiment of the shear apparatus of this invention.

As illustrated in FIG. 1, there are two each of the first and second essentric drive members 22, 34, respectively, which constrain the above-mentioned desired equal spiral movement of all points on plate 44 relative to stationary plate 14. A plurality of springs 25 are compressed between support 12 and plate 44 for the purpose of assuring that flat surfaces 18, 18a are maintained in abutting contact.

Figure 5:
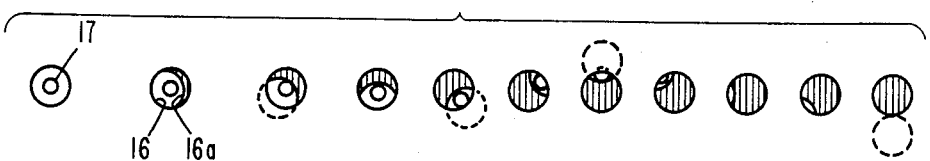
FIG. 5 is a graphic view illustrating relative movement between a pair of the apertures during an exemplary shearing operation.

In operation exemplary wires 17 of component 15 are inserted through matched arrays of aligned holes 16, 16a. Drive belts 26, 36 are actuated. The eccentric offset between C1 and C2 is 10 mils as is the eccentric offset between C2 and C3. This permits holes 16, 16a to be moved between positions of alignment and a maximum offset of 20 mils as illustrated in FIG. 5. Assuming a diameter of wires 17 being 16 mils, a 20 mil offset will shear the wires 17 since all points on second plate 44 move equally.

Figure 4:
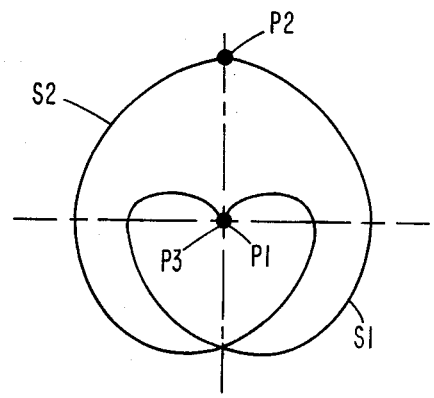
FIG. 4 is a graphic view illustrating an exemplary spiral path of travel of the second plate relative to the first plate.

Further assuming that first drive member 22 rotates clockwise from a position P1 (FIG. 4) wherein holes 16, 16a are substantially aligned, and second drive member 34 rotates clockwise from point P1 (assume 32 and 31 revolutions in a given time period), after member 22 has made 16 revolutions, member 34 has made 15½ revolutions and holes 16a have followed a spiral path S1 to reach a maximum eccentric offset position P2 wherein all pins 17 are sheared and component 15 is removed. Further rotation of member 22 through 16 revolutions and rotation of member 34 of 15½ revolutions along a spiral path S2 returns holes 16, 16a to alignment at a position P3 corresponding with position P1, and the shear sequence can begin again.

As a result of this invention, a fixed plate and a spirally moving plate use a matched array of apertures for simultaneously gripping and cutting a plurality of wire leads. During the cutting operation, the leads are gripped by the fixed and moving plates and are cut by relative motion of the plates. The spirally moving plate rotates about the outer periphery of the cylindrical leads while moving progressly inwardly from the outer periphery until the lead is severed.

Rounded edges 20, 20a may be used to reduce direct shear stress on wires 17 causing the wires to yield more in tension produced by bending rather than only direct shear. The cut edges of wire 17 produced by edges 20, 20a are more rounded, however, more force is required to cut the wires.

The foregoing has described a spiral orbital shear apparatus for limiting the presence of ductile smear cusps on the sheared ends of wire leads of electronic components caused by traditional scissor-type shearing during the assembly of electronic equipment.

It is anticipated that aspects of the present invention, other than those specifically defined in the appended claims, can be obtained from the foregoing description and the drawings.

Having thus described the invention, what is claimed is:

1. A spiral orbital shear apparatus comprising:
a first fixed plate having a planar surface and including an array of apertures formed therethrough;
a second plate including said array of apertures, said second plate having a planar surface abutting said first plate planar surface;
a first eccentric drive member;
first means connected for rotating said first eccentric drive member at a first rate in a first direction;
a second eccentric drive member connected to said second plate and connected to rotate with said first eccentric drive member; and
second means connected for rotating said second eccentric drive member at a second rate in said first direction independently of said first means for rotating.

2. The apparatus of claim 1 wherein said second rate of rotation is slower than said first rate.

3. The apparatus of claim 1 wherein said first and second eccentric drive numbers and said first and second means for rotating, move said second plate relative to said first plate from a first position, wherein said arrays of apertures in said first and second plates are in alignment to a second position, wherein said arrays of apertures in said first and second plates are out of alignment.

4. The apparatus of claim 3 wherein said first and second eccentric drive members and said first and second means for rotating, further move said second plate relative to said first plate from said second position to said first position.

5. The apparatus of claim 2 wherein said first and second eccentric drive members and said first and second means for rotating, move said second plate relative to said first plate from a first position, wherein said arrays of apertures in said first and second plates are in alignment, to a second position, wherein said arrays of apertures in said first and second plates are out of alignment.

6. The apparatus of claim 5 wherein said first and second eccentric drive members and said first and second means for rotating, further move said second plate relative to said first plate from said second position to said first position.

7. The apparatus of claim 1 wherein said first and second eccentric drive members and said first and second means for rotating, move said second plate in a spiral path relative to said first plate from a first position, wherein said arrays of apertures in said first and second plates are in alignment, to a second position, wherein said arrays of apertures in said first and second plates are out of alignment.

8. The apparatus of claim 7 wherein said first and second eccentric drive members and said first and second means for rotating, further move said second plate in a spiral path relative to said first plate from said second position to said first position.

9. The apparatus of claim 2 wherein said first and second eccentric drive members and said first and second means for rotating, move said second plate in a spiral path from a first position, wherein said arrays of apertures in said first and second plates are in alignment, to a second position, wherein said arrays of apertures are out of alignment.

10. The apparatus of claim 9 wherein said first and second eccentric drive members and said first and second means for rotating, further move said second plate in a spiral path relative to said first plate from said second position to said first position.

11. A spiral orbital shear apparatus comprising:

a first fixed plate having a planar surface and including an array of apertures formed therethrough;

a second plate including said array of apertures, said second plate having a planar surface abutting said first plate planar surface; and means for moving said second plate in a spiral path relative to said first plate from a first position, wherein said arrays of apertures in said first and second plates are in alignment, to a second position, wherein said arrays of apertures in said first and second plates are out of alignment, and for further moving said second plate from said second position to said first position, said means including a first eccentric drive member, first means connected for rotating said first eccentric drive member at a first rate in a first direction, a second eccentric drive member connected to said second plate and connected to rotate with said first eccentric drive member, and second means connectd for rotating said second eccentric drive member at a second rate, slower than said first rate, in said first direction independently of said first means for rotating.

12. The apparatus of claim 11 wherein said apertures of each of said first and second plates have rounded edges adjacent said abutting planar surfaces.

* * * * *